US010079367B2

(12) United States Patent
Li et al.

(10) Patent No.: US 10,079,367 B2
(45) Date of Patent: Sep. 18, 2018

(54) WATERPROOF AND ANTI-REFLECTIVE FLEXIBLE OLED APPARATUS AND METHOD FOR MANUFACTURING THE SAME

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Rui Li, Beijing (CN); Jilong Li, Beijing (CN); Cheng Chen, Beijing (CN); Dezhi Xu, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 15/218,713

(22) Filed: Jul. 25, 2016

(65) Prior Publication Data
US 2017/0104183 A1  Apr. 13, 2017

(30) Foreign Application Priority Data
Oct. 13, 2015  (CN) .......................... 2015 1 0657673

(51) Int. Cl.
*H01L 51/52* (2006.01)

(52) U.S. Cl.
CPC ...... *H01L 51/5281* (2013.01); *H01L 51/5253* (2013.01); *H01L 2251/5338* (2013.01); *H01L 2251/5369* (2013.01)

(58) Field of Classification Search
None
See application file for complete search history.

(56) References Cited

U.S. PATENT DOCUMENTS 8,471,456 B2  6/2013  Bechtel et al.
8,692,446 B2  4/2014  Zhang et al.
(Continued)

FOREIGN PATENT DOCUMENTS

CN    1960025 A    5/2007
CN    101040397 A    9/2007
(Continued)

OTHER PUBLICATIONS

Second Office Action regarding Chinese Application No. 201510657673.9, dated May 15, 2017. Translation provided by Dragon Intellectual Property Law Firm.
(Continued)

*Primary Examiner* — Lex Malsawma
(74) *Attorney, Agent, or Firm* — Harness, Dickey & Pierce, P.L.C.

(57) ABSTRACT

The present disclosure relates to an Organic Light-Emitting Diode (OLED) apparatus and a method for manufacturing the same. The OLED apparatus comprises an OLED device, a device packaging layer, an upper flexible substrate, and a lower flexible substrate, wherein an anti-reflection layer is arranged outside the upper flexible substrate, and a layer of inorganic nanoparticles is provided on a surface of the anti-reflection layer. Using the technical solution of the present disclosure, an OLED apparatus which has both waterproof and anti-reflection effects and a small overall thickness is obtained.

20 Claims, 2 Drawing Sheets

(56) References Cited

U.S. PATENT DOCUMENTS

| | | | |
|---|---|---|---|
| 8,754,434 B1* | 6/2014 | Gollier | H01L 51/5253 257/434 |
| 8,816,371 B2* | 8/2014 | Watkins | B29D 11/00634 257/98 |
| 8,946,754 B2 | 2/2015 | Gollier et al. | |
| 2005/0195486 A1* | 9/2005 | Sasaki | G02B 1/11 359/580 |
| 2006/0134428 A1* | 6/2006 | Miyazaki | C09D 4/00 428/411.1 |
| 2008/0093977 A1 | 4/2008 | Bechtel et al. | |
| 2009/0058268 A1* | 3/2009 | Yoshida | B82Y 20/00 313/504 |
| 2009/0142562 A1* | 6/2009 | Miyagawa | B32B 7/02 428/212 |
| 2009/0272996 A1* | 11/2009 | Chakraborty | H01L 33/501 257/98 |
| 2010/0019664 A1* | 1/2010 | Mishima | H01L 51/5268 313/504 |
| 2010/0059778 A1 | 3/2010 | Shimizu et al. | |
| 2011/0215353 A1* | 9/2011 | Won | H01L 33/508 257/98 |
| 2012/0206923 A1* | 8/2012 | Tanaka | B29C 44/0438 362/326 |
| 2012/0234460 A1* | 9/2012 | Zhang | B82Y 20/00 156/67 |
| 2014/0291656 A1 | 10/2014 | Gollier et al. | |
| 2015/0092276 A1* | 4/2015 | Miyake | G02B 5/0242 359/599 |
| 2015/0176797 A1* | 6/2015 | Inoue | H01L 51/5268 362/311.01 |
| 2015/0225631 A1* | 8/2015 | Xiao | C08F 22/10 349/106 |
| 2015/0362648 A1* | 12/2015 | Park | G02F 1/133528 349/96 |
| 2016/0064696 A1* | 3/2016 | Collier | H01L 21/477 428/161 |
| 2016/0131806 A1 | 5/2016 | Koshitouge | |

FOREIGN PATENT DOCUMENTS

| | | |
|---|---|---|
| CN | 102751447 A | 10/2012 |
| CN | 102832350 A | 12/2012 |
| CN | 103443952 A | 12/2013 |
| CN | 104218154 A | 12/2014 |
| CN | 104218173 A | 12/2014 |
| CN | 104300091 A | 1/2015 |
| CN | 104851844 A | 8/2015 |
| JP | 2007335253 A | 12/2007 |
| TW | 201444138 A | 11/2014 |
| WO | WO-2014199921 A1 | 12/2014 |

OTHER PUBLICATIONS

Office Action regarding Chinese Patent Application No. 201510657673.9, dated Oct. 20, 2016. Translation provided by Dragon Intellectual Property Law Firm.

Third Chinese Office Action regarding Application No. 201510657673.9 dated Nov. 23, 2017. English translation provided by http://globaldossier.uspto.gov.

Fourth Chinese Office Action regarding Application No. 201510657673.9 dated May 17, 2018. Translation provided by Dragon Intellectual Property Law Firm.

* cited by examiner

WATERPROOF AND ANTI-REFLECTIVE FLEXIBLE OLED APPARATUS AND METHOD FOR MANUFACTURING THE SAME

CROSS-REFERENCE TO RELATED APPLICATION

This application claims a priority to Chinese Patent Application No. 201510657673.9 filed on Oct. 13, 2015, the disclosures of which are incorporated in their entirety by reference herein.

TECHNICAL FIELD

The present disclosure relates to a waterproof and anti-reflective flexible OLED apparatus and a method for manufacturing the same, and belongs to the field of flexible OLED display technology.

BACKGROUND

An Organic Light-Emitting Diode (OLED) display apparatus comprises a substrate, an anode, an organic film layer, a cathode, a packaging layer and a packaging coverplate, and has a bright application prospect for having advantages as follows: light weight, thinness, wide view angle, active light emission, continuous and adjustable colour of the emitted light, low cost, fast response, low energy consumption, low driving voltage, wide range of working temperatures, simple production process, high luminous efficiency and ability to realize flexible display. Thus, the OLED display apparatus attracts great attention in industrial and scientific fields.

Since interfaces between respective layers of the OLED have different refractive indexes, when light passes through these interfaces, with the occurrence of total internal reflection, photons finally exiting the surface of glass account for only 20% of a total amount of the photons, which will bring about problems as follows: (1) low output of light leads to a need to use a light-emitting material of high grade and to increase input current so as to meet the request of brightness, and thus results in increase in the cost and decrease in the service life; (2) energy that cannot be taken out (about 80%) will be converted into heat to increase the temperature of the organic functional layer, which will not only deteriorate the stability and photoelectric performance of the OLED, but also shorten the service life of the OLED; and (3) a heat dissipation device must be provided in order to eliminate influence of heat on the service life and performance of the OLED, which will increase the production cost. Therefore, it is necessary to design and improve the OLED device so as to improve the output of light.

Moreover, studies have shown that water vapor and oxygen in air have great influence on the service life of the OLED, and the reasons for this are mainly analyzed form the following aspects: when the OLED works, electrons are to be injected into the cathode, which requires the work function of the cathode to be as low as possible, however, metals for making the cathode such as aluminum, magnesium, calcium, etc, are usually active, and apt to react with water vapor penetrating therein. In addition, the water vapor will also react with a hole transport layer and an electron transport layer (ETL), and such reactions will cause failure of the device. Therefore, it is necessary to effectively package the OLED to separate the functional layers of the OLED device from the water vapor, oxygen and the like in air, whereby the service life of the device can be prolonged.

SUMMARY

The object of the present disclosure is to provide an Organic Light-Emitting Diode (OLED) apparatus which has both waterproof and anti-reflection effects and a small overall thickness.

An OLED apparatus comprises an OLED device, a device packaging layer, an upper flexible substrate and a lower flexible substrate, wherein an anti-reflection layer is further arranged outside the upper flexible substrate, and a layer of inorganic nanoparticles is provided on a surface of the anti-reflection layer.

In one example of the OLED apparatus according to the present disclosure, the surface of the anti-reflection layer has a convex-concave microstructure, and a thickness of the anti-reflection layer is 2 to 3 μm and in one embodiment, the thickness is 2.6 μm; and the anti-reflection layer is made of an organic material having inorganic nanoparticles dispersed therein. In one example, in the organic material having inorganic nanoparticles dispersed therein, a molar ratio of the inorganic nanoparticles to the organic material is 5 to 10:1.

In one example of the OLED apparatus according to the present disclosure, surfaces of the inorganic nanoparticles are modified by a coupling agent, wherein the coupling agent accounts for 1 to 3 wt % of a total mass of the inorganic nanoparticles.

In one example of the OLED apparatus according to the present disclosure, a refractive index of the anti-reflection layer is greater than refractive indexes of the upper flexible substrate and the lower flexible substrate.

In one example of the OLED apparatus according to the present disclosure, the organic material is selected from organic silicone resin and a polyacrylate-based organic material, and in one embodiment, is selected from negative polyacrylate-based organic membrane materials.

In one example of the OLED apparatus according to the present disclosure, a visible light transmittance of the inorganic nanoparticles is higher than a preset visible light transmittance, and a light absorbance of the inorganic nanoparticles is lower than a preset light absorbance.

In one example of the OLED apparatus according to the present disclosure, the inorganic nanoparticles comprise one or more selected from $SiO_2$, $TiO_2$ and $Al_2O_3$.

In one example of the OLED apparatus according to the present disclosure, the coupling agent is one or more selected from KH550, KH560 and KH570.

The present disclosure further provides a method for manufacturing the OLED apparatus, comprising:

(1) modifying surfaces of the inorganic nanoparticles;

(2) dispersing a part of the modified inorganic nanoparticles in an organic material and performing degasification in a vacuum chamber; and then coating the organic material having the inorganic nanoparticles dispersed therein onto the upper flexible substrate of the OLED device so as to form an anti-reflection layer;

(3) forming a convex-concave microstructure on a surface of the anti-reflection layer using an exposing and developing process; and (4) depositing the remaining inorganic nanoparticles after step (2) onto the surface of the convex-concave microstructure of the anti-reflection layer using a plasma-chemical vapor deposition process.

In one example of the method for manufacturing the OLED apparatus according to the present disclosure, modifying surfaces of the inorganic nanoparticles in step (1) comprises: adding a coupling agent in a solvent and heating them until the coupling agent is dissolved completely, adding the inorganic nanoparticles into the solution of the coupling agent, and stirring to allow the inorganic nanoparticles to make full contact with the solution of the coupling agent; thereafter, washing the inorganic nanoparticles with absolute ethanol and deionized water and drying under vacuum, so as to obtain the inorganic nanoparticles whose surfaces have been modified by the coupling agent. In one embodiment, the solvent is ethanol or toluene, and the stirring is mechanical stirring and/or ultrasonic stirring.

In one example of the method for manufacturing the OLED apparatus according to the present disclosure, the coating in step (2) is screen printing, transferring or spin coating.

In one example of the method for manufacturing the OLED apparatus according to the present disclosure, the exposing and developing process in step (3) is performed at a pre-exposure temperature of 100 to 120 □ and in one embodiment, at a pre-exposure temperature of 100 □, using a photoresist developing solution containing organic amine or inorganic salt. In one embodiment, the photoresist developing solution contains tetramethylammonium hydroxide (TMAH) or potassium hydroxide. In a further embodiment, the photoresist developing solution is a solution containing TMAH at a concentration of 2.38%.

In one example of the method for manufacturing the OLED apparatus according to the present disclosure, the plasma-chemical vapor deposition process in step (4) is performed at a reaction temperature of 250 to 350 □ using silane and nitrous oxide in a plasma state and using a preparation device manufactured by AKT Co.

The reaction equation of the plasma-chemical vapor deposition is:

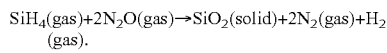

$SiH_4(gas)+2N_2O(gas) \rightarrow SiO_2(solid)+2N_2(gas)+H_2$ (gas).

The advantageous effects of the present disclosure are as follows:

In the present disclosure, inorganic nanoparticles having high light transmittance and low light absorbance are dispersed in an organic material having high light transmittance and moderate refractive index, as a result, an anti-reflection effect of the optical transition layer thus formed can be enhanced by 20% to 50%. Moreover, a convex-concave microstructure is formed on the surface of the organic host and then a layer of inorganic nanoparticles is coated on the microstructure, as a result, the adhesive force between the organic host material and the inorganic nanoparticles are improved, and waterproof effect is increased as well. By using the technical solution of the present disclosure, an OLED apparatus which has both waterproof and anti-reflection effects and a small overall thickness is obtained.

Figure 1:
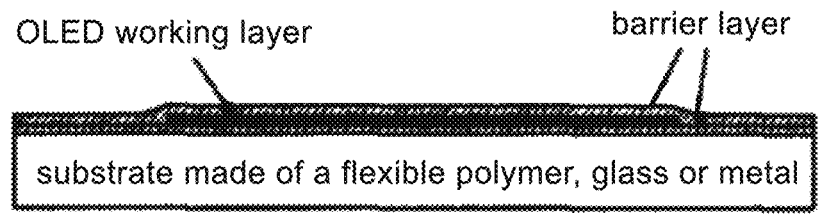
FIG. 1 is a schematic diagram (sectional view) of a flexible OLED device in the related art.

Reference signs in the drawings: 1. OLED device; 2. device packaging layer; 3. upper flexible substrate; 4. lower flexible substrate; 5. anti-reflection layer; 6. inorganic nanoparticle.

DETAILED DESCRIPTION

Figure 2:
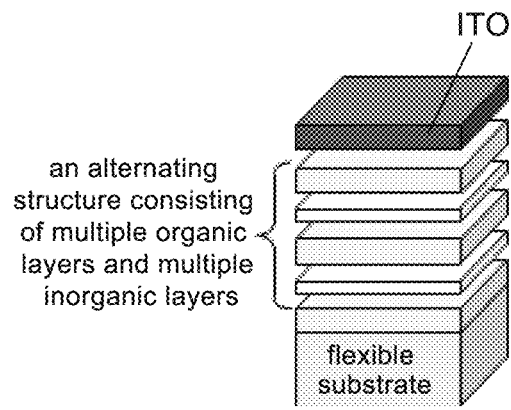
FIG. 2 is a schematic diagram (sectional view) of another flexible OLED device in the related art.

In the related art, an effective method of packaging a flexible OLED is providing a single or multiple layers of thin films on the substrate and the functional layers so as to prevent the penetration of water, oxygen and other ingredients, or adding some membrane layers having different refractive indexes so as to improve the light-exiting rate, as shown in FIGS. 1 and 2. However, the designed structures having both waterproof and anti-reflection effects will also leads to an increase of the overall thickness of the OLED device.

The following embodiments are for illustrating the present disclosure, but shall not be used to limit the scope thereof.

Figure 3:
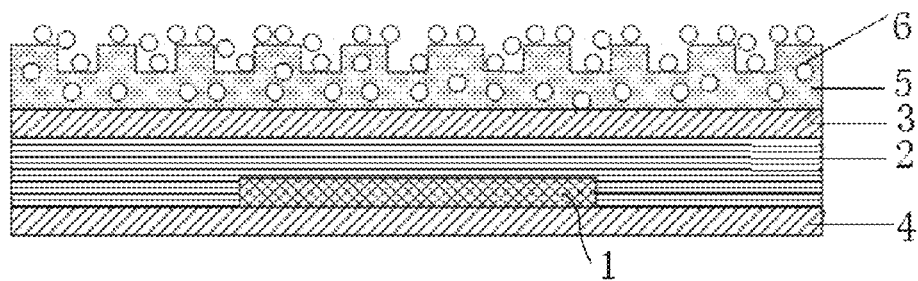
FIG. 3 is a schematic diagram (sectional view) of an OLED apparatus having waterproof and anti-reflection functions according to the present disclosure.

As shown in FIG. 3, an Organic Light-Emitting Diode (OLED) apparatus provided in the present disclosure comprises an OLED device 1, a device packaging layer 2, an upper flexible substrate and a lower flexible substrate 4, wherein an anti-reflection layer 5 is arranged outside the upper flexible substrate 3, and a layer of inorganic nanoparticles 6 is provided on a surface of the anti-reflection layer 5. By additionally arranging the anti-reflection layer outside the upper flexible substrate of the OLED apparatus in the related art and then providing a layer of inorganic nanoparticles on the surface of the anti-reflection layer, it is able to prevent the OLED from being damaged by a barrier layer. Compared to the water-vapor barrier layer and the anti-reflection layer arranged inside the flexible OLED packaging apparatus in the related art, the anti-reflection layer and the layer of inorganic nanoparticles according to the present disclosure can better protect the internal light-emitting device of OLED and the anti-reflection effect of the OLED apparatus can be enhanced by 20% to 50%, meanwhile the overall thickness of the OLED apparatus is not significantly increased. Thus, the technical problem existing in the related art that waterproof and anti-reflection effects and a small overall thickness cannot be ensured at the same time is solved.

The anti-reflection layer is made from an organic material having inorganic nanoparticles dispersed therein, wherein in the organic material having inorganic nanoparticles dispersed therein, the molar ratio of the inorganic nanoparticles to the organic material is 5 to 10:1. By reasonably adjusting the molar ratio of the inorganic nanoparticles to the organic material, waste can be avoided and significant effect can be ensured as well. A surface of the anti-reflection layer has a convex-concave microstructure and a thickness of the anti-reflection layer is 2 to 3 μm, and in one embodiment, the thickness is 2.6 μm. Therefore, it is able to increase the surface area and thus increase the number of the inorganic nanoparticles, as well as enhance the adhesive force between the inorganic nanoparticles and the anti-reflection layer and thus significantly improve the effect of the waterproof layer.

Surfaces of the inorganic nanoparticles are modified by a coupling agent, wherein the coupling agent accounts for 1 to 3 wt % of a total mass of the inorganic nanoparticles. By modifying the surfaces of the inorganic nanoparticles using a coupling agent, the inorganic nanoparticles will dissolve in the organic material more easily. A visible light transmittance of the inorganic nanoparticles is higher than a preset visible light transmittance, and a light absorbance of the inorganic nanoparticles is lower than a preset light absorbance. The inorganic nanoparticles comprise one or more selected from $SiO_2$, $TiO_2$ and $Al_2O_3$. The coupling agent is one or more selected from KH550, KH560 and KH570. Although the inorganic nanoparticles have good waterproof effect, their adhesive force is poor and it is easy for them to be peeled off. Therefore, waterproof effect of the lower anti-reflection layer is limited. However, by forming a convex-concave microstructure on the surface of the anti-reflection layer, it is able to improve a contact area and the adhesive force between the anti-reflection layer and the inorganic nanoparticles, and thus increase the coverage of the inorganic nanoparticles, thereby realizing an increase in the waterproof effect.

A refractive index of the anti-reflection layer is greater than refractive indexes of the upper flexible substrate and the lower flexible substrate. In one embodiment, the anti-reflection layer comprises organic silicone resin or a polyacrylate-based organic material, and in a further embodiment, it comprises a negative polyacrylate-based organic membrane material. By dispersing the inorganic nanoparticles whose transmittance is slightly greater than the preset visible light transmittance inside the anti-reflection layer whose refractive index is slightly greater than that of the substrate, the likelihood of the total internal reflection occurring at the interface when light enters from the substrate into air will be reduced, and the output of light can be improved.

Figure 4:
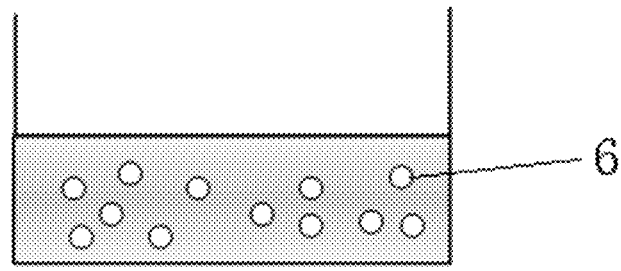
FIG. 4 is a schematic diagram of the modified inorganic nanoparticles according to the present disclosure.
Figure 5:
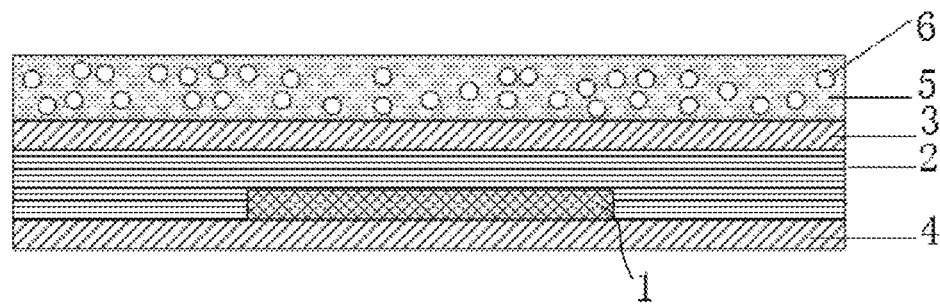
FIG. 5 is a schematic diagram (sectional view) of an OLED device whose surface is coated with an organic host material according to the present disclosure.
Figure 6:
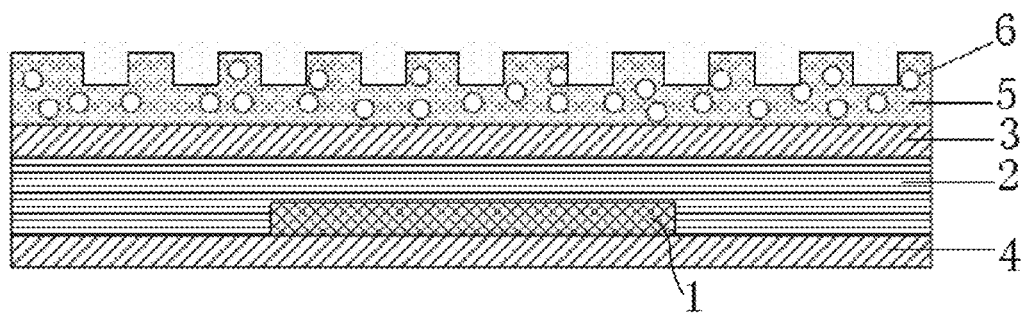
FIG. 6 is an OLED apparatus having an organic host layer with a convex-concave microstructured surface according to the present disclosure.

The present disclosure further provides a method for manufacturing the OLED apparatus described above, comprising:

(1) modifying surfaces of the inorganic nanoparticles, as shown in FIG. 4;

(2) dispersing a part of the modified inorganic nanoparticles in an organic material and performing degasification in a vacuum chamber; and then coating the organic material having the inorganic nanoparticles dispersed therein onto the upper flexible substrate of the OLED device so as to form an anti-reflection layer, as shown in FIG. 5;

(3) forming a convex-concave microstructure on the surface of the anti-reflection layer using an exposing and developing process, as shown in FIG. 6; and (4) depositing the remaining inorganic nanoparticles after step (2) onto the surface of the convex-concave microstructure of the anti-reflection layer using a plasma-chemical vapor deposition process, as shown in FIG. 3.

In the method for manufacturing the OLED apparatus according to the present disclosure, modifying the surfaces of the inorganic nanoparticles in step (1) comprises: adding a coupling agent in a solvent and heating them until the coupling agent is dissolved completely, adding the inorganic nanoparticles into the solution of the coupling agent, and stirring to allow the inorganic nanoparticles to make full contact with the solution of the coupling agent; thereafter, washing the inorganic nanoparticles with absolute ethanol and deionized water and drying under vacuum, so as to obtain the inorganic nanoparticles whose surfaces have been modified by the coupling agent, wherein the solvent is ethanol or toluene, and the stirring is mechanical stirring and/or ultrasonic stirring.

In the method for manufacturing the OLED apparatus according to the present disclosure, a thickness of the anti-reflection layer in step (2) is 2 to 3 µm, and in one embodiment, is 2.6 µm.

In the method for manufacturing the OLED apparatus according to the present disclosure, the coating in step (2) is screen printing, transferring or spin coating.

In the method for manufacturing the OLED apparatus according to the present disclosure, the exposing and developing process in step (3) is performed at a pre-exposure temperature of 100 to 120 □, and in one embodiment, at a pre-exposure temperature of 100 □, using a photoresist developing solution containing organic amine or inorganic salt. In one embodiment, the photoresist developing solution contains TMAH or potassium hydroxide, and in a further embodiment, the photoresist developing solution is a solution containing TMAH at a concentration of 2.38%.

In the method for manufacturing the OLED apparatus according to the present disclosure, the plasma-chemical vapor deposition process in step (4) is performed at a reaction temperature of 250 to 350 □ using silane and nitrous oxide in a plasma state.

By forming a convex-concave microstructured surface on the organic host layer using the exposing and developing process and coating a layer of inorganic nanoparticles having high water adsorptive performance on the microstructured surface, waterproof and antioxidation effects are ensured and meanwhile the drawback caused by the poor adhesive force of the inorganic nanoparticles can be remedied. As compared with other structural design of waterproof and anti-reflective OLED which use multiple layers of structural membranes to achieve the waterproof and anti-reflection effect, the OLED apparatus according to the present disclosure can ensure a smaller overall thickness while having the waterproof and anti-reflection effects.

Embodiment 1: An OLED Apparatus

This embodiment provides an OLED apparatus which comprises an OLED device 1, a device packaging layer 2, an upper flexible substrate 3, and a lower flexible substrate 4, wherein an anti-reflection layer 5 is arranged outside the upper flexible substrate 3, and a layer of inorganic nanoparticles 6 is provided on the surface of the anti-reflection layer.

In the OLED apparatus, the surface of the anti-reflection layer has a convex-concave microstructure, and a thickness of the anti-reflection layer is 2.6 µm; the anti-reflection layer is made of a negative polyacrylate-based organic material having $SiO_2$ nanoparticles dispersed therein, wherein a molar ratio of the $SiO_2$ nanoparticles to the negative polyacrylate-based organic material is 8:1.

Surfaces of the inorganic nanoparticles are modified by a coupling agent KH550, wherein the coupling agent accounts for 2 wt % of a total mass of the inorganic nanoparticles.

Embodiment 2: An OLED Apparatus

This embodiment provides an OLED apparatus similar to that in Embodiment 1, and the OLED apparatus in this embodiment differs from that in Embodiment 1 in that:

1) the anti-reflection layer is made of an organic silicone resin material having $TiO_2$ nanoparticles dispersed therein, wherein the molar ratio of the $TiO_2$ nanoparticles to the organic silicone resin material is 5 to 1;

2) surfaces of the inorganic nanoparticles are modified by a coupling agent KH560, wherein the coupling agent accounts for 1 wt % of a total mass of the inorganic nanoparticles;

3) the thickness of the anti-reflection layer is 2 µm.

Embodiment 3: An OLED Apparatus

This embodiment provides an OLED apparatus similar to that in Embodiment 1, and the OLED apparatus in this embodiment differs from that in Embodiment 1 in that:

1) the anti-reflection layer is made of an organic silicone resin material having $Al_2O_3$ nanoparticles dispersed therein, wherein the molar ratio of the $Al_2O_3$ nanoparticles to the organic silicone resin material is 10 to 1;

2) surfaces of the inorganic nanoparticles are modified by a coupling agent KH570, wherein the coupling agent accounts for 3 wt % of a total mass of the inorganic nanoparticles;

3) the anti-reflection layer has a thickness of 3 μm.

Embodiment 4: A Method for Manufacturing an OLED Apparatus

This embodiment provides a method for manufacturing the OLED apparatus of Embodiment 1, comprising:

(1) modifying surfaces of the inorganic nanoparticles;

(2) dispersing a part of the modified inorganic nanoparticles in an organic material and performing degasification in a vacuum chamber; and then coating the organic material having the inorganic nanoparticles dispersed therein onto an upper flexible substrate of an OLED device so as to form an anti-reflection layer;

(3) forming a convex-concave microstructure on a surface of the anti-reflection layer using an exposing and developing process; and (4) depositing the remaining inorganic nanoparticles after step (2) onto the surface of the convex-concave microstructure of the anti-reflection layer using a plasma-chemical vapor deposition process.

In step (1), modifying the surfaces of the inorganic nanoparticles comprises: adding a coupling agent in a solvent and heating them until the coupling agent is dissolved completely, adding the inorganic nanoparticles into the solution of the coupling agent, and mechanically stirring to allow the inorganic nanoparticles to make full contact with the solution of the coupling agent; thereafter, washing the inorganic nanoparticles with absolute ethanol and deionized water and drying under vacuum, so as to obtain the inorganic nanoparticles whose surfaces have been modified by the coupling agent. The solvent is ethanol or toluene.

In step (2), the coating is screen printing.

In step (3), the exposing and developing process is performed at a pre-exposure temperature of 100 □ using a photoresist developing solution which is a solution containing TMAH at a concentration of 2.38%.

In step (4), the plasma-chemical vapor deposition process is performed at a reaction temperature of 250 to 350 □ using silane and nitrous oxide in a plasma state and using a device manufactured by AKT Co.

Embodiment 5: A Method for Manufacturing an OLED Apparatus

This embodiment adopts the same method as that in Embodiment 4 to manufacture an OLED apparatus, except that:

1) in step (1), the stirring is ultrasonic stirring;

2) in step (2), the coating is transferring;

3) in step (3), the exposing and developing process is performed at a pre-exposure temperature of 100 □ using a photoresist developing solution containing potassium hydroxide.

Embodiment 6: A Method for Manufacturing an OLED Apparatus

This embodiment adopts the same method as that in Embodiment 4 to manufacture an OLED apparatus, except that:

1) in step (2), the coating is spin coating;

2) in step (3), the exposing and developing process is performed at a pre-exposure temperature of 100 □ using a photoresist developing solution containing potassium hydroxide.

Embodiment 7: A Method for Manufacturing an OLED Apparatus

This embodiment adopts the same method as that in Embodiment 4 to manufacture an OLED apparatus, except that:

1) in step (1), the stirring is ultrasonic stirring;

2) in step (2), the coating is spin coating;

3) in step (3), the exposing and developing process is performed at a pre-exposure temperature of 100 □ using a photoresist developing solution containing potassium hydroxide.

Effect Verification

In order to better explain the beneficial effects achieved by the OLED apparatus according to the present disclosure, the waterproof performance, anti-reflection performance and thicknesses of the OLED apparatuses of embodiments 1-3 are detected. Results are given below:

|  | Waterproof performace | Anti-reflection performance | thickness |
| --- | --- | --- | --- |
| Embodiment 1 | excellent | excellent | relatively thin |
| Embodiment 2 | excellent | good | relatively thin |
| Embodiment 3 | good | excellent | relatively thin |
| OLED apparatus in the related art (FIG. 2) | fair | fair | thick |

Although the present disclosure is described in the above in detail through general descriptions and embodiments, modifications or improvements may be made to the present disclosure on the basis of the above, and such modifications and improvements are obvious to those skilled in the art. Therefore, all these modifications and improvements made without departing from the spirit of the present disclosure shall fall within the protection scope of the present disclosure.

What is claimed is:

1. An Organic Light-Emitting Diode (OLED) apparatus, comprising:
    a first flexible substrate;
    a second flexible substrate;
    an OLED device located between the first flexible substrate and the second flexible substrate;
    a device packaging layer located between the first flexible substrate and the second flexible substrate;
    an anti-reflection layer provided directly on and in physical contact with a side of the first flexible substrate that is facing away from the OLED device, and comprising an organic material and inorganic nanoparticles dispersed in the organic material, wherein a surface of the anti-reflection layer that is facing away from the OLED device has a convex-concave microstructure; and
    a layer of inorganic nanoparticles provided directly on and in physical contact with the surface of the anti-reflection layer having a convex-concave microstructure.

2. The OLED apparatus according to claim 1, wherein a thickness of the anti-reflection layer is 2 to 3 μm.

3. The OLED apparatus according to claim 2, wherein a molar ratio of the inorganic nanoparticles to the organic material is 5 to 10:1.

4. The OLED apparatus according to claim 1, wherein a refractive index of the anti-reflection layer is greater than refractive indexes of the first flexible substrate and the second flexible substrate.

5. The OLED apparatus according to claim 1, wherein the anti-reflection layer comprises organic silicone resin or a polyacrylate-based organic material.

6. The OLED apparatus according to claim 5, wherein the anti-reflection layer comprises a negative polyacrylate-based organic membrane material.

7. The OLED apparatus according to claim 1, wherein surfaces of the inorganic nanoparticles are modified by a coupling agent, and the coupling agent accounts for 1 to 3 wt % of a total mass of the inorganic nanoparticles.

8. The OLED apparatus according to claim 7, wherein the coupling agent is one or more selected from KH550, KH560 and KH570.

9. The OLED apparatus according to claim 1, wherein a visible light transmittance of the inorganic nanoparticles is higher than a preset visible light transmittance, and a light absorbance of the inorganic nanoparticles is lower than a preset light absorbance.

10. The OLED apparatus according to claim 7, wherein the inorganic nanoparticles comprise one or more selected from $SiO_2$, $TiO_2$ and $Al_2O_3$.

11. A method for manufacturing an Organic Light-Emitting Diode (OLED) apparatus, comprising:
   providing a first flexible substrate and a second flexible substrate;
   providing an OLED device and a device packaging layer both of which are located between the first flexible substrate and the second flexible substrate;
   coating an organic material having the inorganic nanoparticles dispersed within the organic material and onto a side of the first flexible substrate that is facing away from the OLED device so as to form an anti-reflection layer;
   forming a convex-concave microstructure on a surface of the anti-reflection layer that is facing away from the OLED device; and
   depositing inorganic nanoparticles onto the surface of the convex-concave microstructure of the anti-reflection layer so as to form a layer of inorganic nanoparticles.

12. The method according to claim 11, wherein surfaces of the nanoparticles are modified by a coupling agent.

13. The method according to claim 11, wherein the surfaces of the inorganic nanoparticles are modified by a process comprising:
   adding a coupling agent in a solvent and heating them until the coupling agent is dissolved completely;
   adding the inorganic nanoparticles into a solution of the coupling agent, and stirring to allow the inorganic nanoparticles to make full contact with the solution of the coupling agent; and
   thereafter, washing the inorganic nanoparticles with absolute ethanol and deionized water and drying under vacuum, so as to obtain the inorganic nanoparticles whose surfaces have been modified by the coupling agent.

14. The method according to claim 11, wherein the solvent comprises ethanol or toluene, and the stirring comprises mechanical stirring or ultrasonic stirring.

15. The method according to claim 11, wherein the convex-concave microstructure is formed using an exposing and developing process.

16. The method according to claim 15, wherein the exposing and developing process is performed at a pre-exposure temperature of 100 to 120° C. using a photoresist developing solution comprising organic amine or inorganic salt.

17. The method according to claim 16, wherein the photoresist developing solution comprises tetramethylammonium hydroxide (TMAH) or potassium hydroxide.

18. The method according to claim 17, wherein the photoresist developing solution comprises a solution including the TMAH at a concentration of 2.38%.

19. The method according to claim 11, wherein the inorganic nanoparticles are deposited onto the surface of the convex-concave microstructure of the anti-reflection layer by a plasma-chemical vapor deposition process.

20. The method according to claim 19, wherein the plasma-chemical vapor deposition process is performed at a reaction temperature of 250 to 350° C. using silane and nitrous oxide in a plasma state.

* * * * *